(12) United States Patent
Wong et al.

(10) Patent No.: US 10,128,333 B2
(45) Date of Patent: Nov. 13, 2018

(54) FINFET WITH ISOLATED SOURCE AND DRAIN

(71) Applicant: GLOBALFOUNDRIES INC., Grand Cayman (KY)

(72) Inventors: Hoong Shing Wong, Clifton Park, NY (US); Min-hwa Chi, San Jose, CA (US); Tae-Hoon Kim, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/627,973

(22) Filed: Jun. 20, 2017

(65) Prior Publication Data

US 2017/0288016 A1    Oct. 5, 2017

Related U.S. Application Data

(62) Division of application No. 14/172,362, filed on Feb. 4, 2014.

(51) Int. Cl.
| | |
|---|---|
| *H01L 29/06* | (2006.01) |
| *H01L 29/10* | (2006.01) |
| *H01L 29/78* | (2006.01) |
| *H01L 29/66* | (2006.01) |
| *H01L 29/08* | (2006.01) |

(52) U.S. Cl.
CPC ...... *H01L 29/0653* (2013.01); *H01L 29/0847* (2013.01); *H01L 29/1083* (2013.01); *H01L 29/66545* (2013.01); *H01L 29/66795* (2013.01); *H01L 29/785* (2013.01)

(58) Field of Classification Search
CPC ............ H01L 29/0653; H01L 29/0847; H01L 29/66545; H01L 29/66795; H01L 29/785
See application file for complete search history.

(56) References Cited

U.S. PATENT DOCUMENTS

| | | | |
|---|---|---|---|
| 7,101,763 B1 | 9/2006 | Anderson et al. | |
| 7,560,358 B1 | 7/2009 | Kim et al. | |
| 7,671,416 B1 | 3/2010 | O et al. | |
| 8,956,942 B2 * | 2/2015 | Loubet | H01L 21/823431 438/164 |
| 2007/0111439 A1 * | 5/2007 | Jung | H01L 21/84 438/254 |
| 2009/0008705 A1 | 1/2009 | Zhu | |

(Continued)

OTHER PUBLICATIONS

J. Pretet, S. Monfray, S. Cristoloveanu, and T. Skotnicki: "Silicon-on-Nothing MOSFETs: Performance, Short-Channel Effects, and Backgate Coupling," IEEE Trans. on Electron Devices, vol. 51, No. 2, pp. 240-245, Feb. 2004.

(Continued)

*Primary Examiner* — Peter Bradford
(74) *Attorney, Agent, or Firm* — Heslin Rothenberg Farley & Mesiti P.C.; Stephen Scuderi

(57) ABSTRACT

A FinFET has shaped epitaxial structures for the source and drain that are electrically isolated from the substrate. Shaped epitaxial structures in the active region are separated from the substrate in the source and drain regions while those in the channel region remain. The gaps created by the separation in the source and drain are filled with electrically insulating material. Prior to filling the gaps, defects created by the separation may be reduced.

14 Claims, 2 Drawing Sheets

(56) References Cited

U.S. PATENT DOCUMENTS

| | | | |
|---|---|---|---|
| 2009/0078997 A1* | 3/2009 | Greene | H01L 21/823807 257/347 |
| 2011/0193178 A1 | 8/2011 | Chang et al. | |
| 2013/0161756 A1 | 6/2013 | Glass | |
| 2013/0270641 A1* | 10/2013 | Chi | H01L 21/823821 257/351 |
| 2014/0008731 A1 | 1/2014 | Koburger, III | |
| 2014/0103441 A1 | 4/2014 | Kim | |
| 2014/0191321 A1* | 7/2014 | Cheng | H01L 21/76283 257/347 |
| 2014/0225065 A1 | 8/2014 | Rachmady | |
| 2014/0264489 A1 | 9/2014 | Wong | |
| 2015/0108585 A1 | 4/2015 | Loubet et al. | |
| 2015/0187909 A1* | 7/2015 | Yan | H01L 29/42392 438/424 |
| 2016/0005852 A1 | 1/2016 | Kim | |
| 2016/0071945 A1* | 3/2016 | Wang | H01L 29/42392 257/347 |

OTHER PUBLICATIONS

S. Monfray, et. al.: "SON (Silicon-On-Nothing) technological CMOS Platform: Highly performant devices and SRAM cells," IEEE IEDM, pp. 635-636, 2004.

S. Kim, et al.: "Silicon on Replacement Insulator (SRI) Floating Body Cell (FBC) Memory," IEEE, VLSI Technology, pp. 165-166, 2010.

K. Roy, S. Mukhopadhyay, H. Mahmoodi-Meimand: "Leakage Current Mechanisms and Leakage Reduction Techniques in Deep-Submicrometer CMOS circuits," Proc. IEEE, vol. 91, No. 2, pp. 305-327, Feb. 2003.

S. Mukhopadhyay, A. Raychowdhury, K. Roy: "Accurate Estimation of Total Leakage in Nanometer-Scale Bulk CMOS Circuits Based on Device Geometry and Doping Profile," IEEE Trans. Computer-Aided Design of Integrated Circuits and Systems, vol. 24, No. 3, pp. 363-381, Mar. 2005.

* cited by examiner

FINFET WITH ISOLATED SOURCE AND DRAIN

CROSS-REFERENCE TO RELATED APPLICATIONS

This application is a divisional of U.S. patent application Ser. No. 14/172,362 filed Feb. 4, 2014, the entirety of which is hereby incorporated herein by reference.

BACKGROUND OF THE INVENTION

Technical Field

The present invention generally relates to electrically isolating region(s) of a transistor, and, more particularly, to electrically isolating the source and drain of a FinFET from the substrate.

Background Information

Semiconductor devices continue to scale downward while circuit densities continue to increase, as well as the expected performance. At the same time, the expectations continue downward for power used, particularly for mobile applications. These expectations put pressure on long-existing problems for semiconductors, such as leakage current, for example, channel subthreshold leakage at short gate length (the so-called "short-channel effect") and junction leakage from the source and drain in a transistor to the substrate. While raising the active area of a transistor to separate it from the substrate (e.g., FinFETs) has helped, the expectations noted continue to trend toward smaller devices, higher densities and lower power.

Therefore, there continues to be a need to further reduce leakage.

SUMMARY OF THE INVENTION

The shortcomings of the prior art are overcome and additional advantages are provided through the provision, in one aspect, of a method of electrically isolating the source and drain of a FinFET from the substrate. The method includes providing a semiconductor structure, the structure including: a semiconductor substrate, at least one semiconductor fin coupled to the semiconductor substrate and surrounded at a bottom portion thereof of a dielectric layer, and an active region having a source region, a drain region and a channel region therebetween, the active region including a layer of epitaxy surrounding a top portion of the at least one semiconductor fin. The structure further includes a dummy gate encompassing the channel region and a spacer on either side of the dummy gate, while the method further includes physically separating the top portion of the at least one semiconductor fin from the bottom portion of the at least one semiconductor fin in the source region and the drain region, the physically separating forming gaps, the physically separating includes recessing the dielectric layer surrounding the bottom portion of the at least one semiconductor fin, the recessing exposing a center portion of the at least one semiconductor fin between the top portion and the bottom portion, and removing the center portion exposed by the recessing. The method further includes, after the physically separating, forming a continuous dielectric layer in the gaps and around the layer of epitaxy in the source region and the drain region.

In accordance with another aspect, a semiconductor structure is provided. The structure includes a semiconductor substrate, and at least one raised semiconductor structure coupled to the substrate. The structure further includes an active region for each of the at least one raised semiconductor structure having a source region, a drain region and a channel region therebetween, the active region including a layer of epitaxy coupled to the at least one raised semiconductor structure at the channel region, and the source region and the drain region being isolated from the at least one raised semiconductor structure by a layer of at least one electrically insulating material.

These, and other objects, features and advantages of this invention will become apparent from the following detailed description of the various aspects of the invention taken in conjunction with the accompanying drawings.

DETAILED DESCRIPTION OF THE INVENTION

Figure 1:
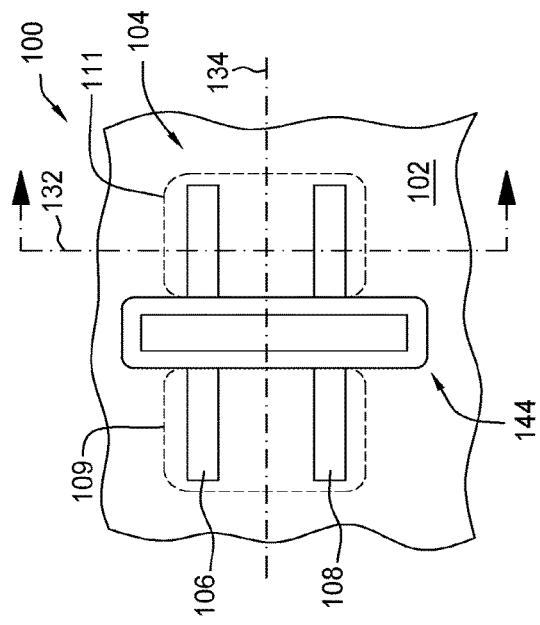
FIG. 1 is a cross-sectional view of a semiconductor structure, in this case, at a source or a drain, at an early stage in the fabrication of a FinFET in accordance with aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, the term "connected," when used to refer to two physical elements, means a direct connection between the two physical elements. The term "coupled," however, can mean a direct connection or a connection through one or more intermediary elements.

Reference is made below to the drawings, which are not drawn to scale for ease of understanding, wherein the same reference numbers are used throughout different figures to designate the same or similar components.

The present invention addresses the leakage from the source and drain to the substrate as well as the leakage between the drain and source in case of a bias. The leakage current from the source or drain to substrate includes the usual reverse biased junction leakage and the gate-induced drain leakage (GIDL) current based on the band-to-band tunneling (BTBT) mechanism. The GIDL current may be dominant as the main source of leakage current from source/drain to substrate in advanced CMOS transistors, e.g., FinFET. The leakage current between the drain and source when the transistor is turned off also includes two components: the usual channel subthreshold current and a "punch-through" current below the channel between the drain and source. The present invention provides structure and methods to drastically reduce or eliminate the reverse biased junction current and the GIDL current from source/drain to substrate, and punch-through current in between the source and drain.

In one or more aspects, and without limiting the scope thereof, the present invention provides a method to form a bulk-FinFET with a "floating" source and drain that are electrically isolated from the substrate by, for example, a dielectric (e.g., oxide or nitride). The active region is made of epitaxy grown on the fin, for example, silicon epitaxy that naturally forms into diamond shapes. An isotropic wet etch, for example, is performed to separate the diamond shaped source and drain from the substrate, while the channel portion of the active region is still electrically and physically coupled to the substrate and, in one aspect, physically supports the active region. At this point, damage from the separation may be repaired, for example, by coating damaged surfaces with an oxide or nitride. An electrical insulator (e.g., oxide/nitride) is deposited conformally, for example, by atomic layer deposition or ALD, to fill in the gaps so that the "floating" source and drain (also referred to as "S/D") of the active region is electrically isolated from the substrate, which also provides support for the S/D.

The method of the present invention is relatively simple and inexpensive, and can easily be integrated into a modern FinFET production flow as a process module. As explained above, the present invention also results in FinFETs, for example, with drastically reduced or eliminated S/D junction leakage to the substrate as well as punch-through current in between the source and drain. This translates into a bulk-FinFET with low power capability. In addition, the present invention reduces S/D capacitance for high performance FinFET circuits. With all the above advantages, there is also no increase in the number of masking steps over conventional bulk FinFETs. As one skilled in the art will know, masking steps tend to be some of the most costly segments of semiconductor fabrication.

Figure 2:
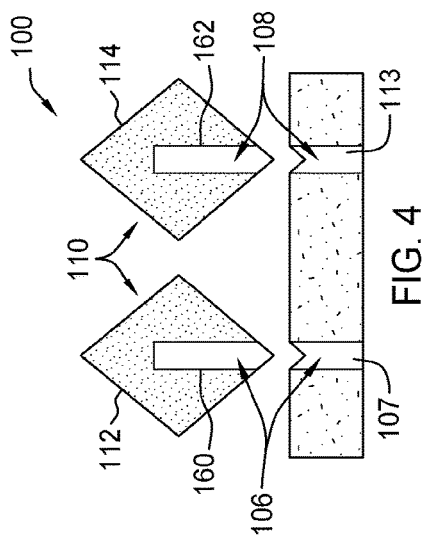
FIG. 2 is a top-down view of one example showing more of the structure of FIG. 1.

FIG. 1 is a cross-sectional view of a semiconductor structure 100, in this case, taken at line 132 in FIG. 2, across a source or a drain portion of a raised structure (see FIG. 2 description below), at an early stage in the fabrication of a FinFET, in accordance with one or more aspects of the present invention. Structure 100 includes a portion of a substrate, in particular, a layer of oxide 102, in which a plurality of fins 104, for example, fins 106 and 108, are stabilized. Continuing with FIG. 1, in this example, semiconductor structure 100 may include a semiconductor fin coupled to semiconductor substrate 103 below oxide 102.

The substrate may include a bulk semiconductor material, e.g., a bulk silicon wafer. In one example, the substrate may include any silicon-containing substrate including, but not limited to, silicon (Si), single crystal silicon, polycrystalline silicon (Poly-Si), amorphous Si, silicon-on-nothing (SON) and the like. The substrate may in addition or instead include various isolations, dopings and/or device features. The substrate may include other suitable elementary semiconductors, such as, for example, crystalline germanium, a compound semiconductor such as silicon carbide (SiC), gallium arsenide (GaAs), gallium antimonide (GaSb), gallium phosphide (GaP), indium phosphide (InP), indium arsenide (InAs), and/or indium antimonide (InSb) or combinations thereof; an alloy semiconductor including GaAsP, AlInAs, GaInAs, GaInP or GaInAsP or combinations thereof. The substrate may be a planar substrate, or three-dimensional, such as FINs or Nanowires.

At a top portion of the fins is a plurality of shaped structures 110, for example, diamond-shaped structures 112 and 114. In this example, the shaped structures comprise epitaxial silicon growth on fins 106 and 108 (with sidewall of (110) surface) on substrate of (100) surface. As one skilled in the art will know, epitaxial silicon naturally grows via a process commonly referred to as selective epitaxial growth (SEG), into a diamond shape (as viewed from the cross-section as in FIG. 1), due to the slower growth rate of the (111) surfaces, labeled 116. SEG may be realized via various methods, for example, chemical vapor deposition (CVD), reduced pressure CVD (RPCVD) or other applicable methods. The selective epitaxial growth starts when at least one semiconductor source gas is injected into the reaction chamber (typically at elevated temperature and reduced pressure). In one example, the semiconductor source gas may be a silicon containing source gas, such as, silane ($SiH_4$) gas, a disilane ($Si_2H_6$) gas, a dichlorosilane ($SiH_2Cl_2$) gas, a $SiHCl_3$ gas and a $SiCl_4$ gas. In another example, germanium or carbon containing precursor may be mixed with the above gases to form SiGe or SiC crystal. Furthermore, III-V and II-VI compounds can also be grown on a crystalline silicon surface by using gases containing respective elements. Further, an HF-dip is typically performed to remove the thin oxide (e.g., native oxide) and expose the silicon (Si) surface before the start of the selective epitaxial growth. The term "selective" as used herein with respect to epitaxial silicon growth refers to growing Si (or, alternatively, epitaxy from Groups III to V of the Periodic Table) on a Si crystal surface. Note that Si epitaxy will not grow on a surface of amorphous material (e.g., oxide or nitride). It will be understood that the lithographic masking steps may be performed to sequentially open a specific area and expose the fins 106, 108 by HF-dip and followed by the selective epitaxial growth.

It is observed that due to different growth rates on different crystal surface planes or orientations, different shapes may be formed. For example, the growth rate on the silicon (Si) surfaces having (111) orientations is slower than that on other planes such as (110) or (100) planes. Accordingly, the resultant diamond shape after SEG results from the slowest epi growth rate on the (111) surface. During the epitaxial growth, a thin silicon layer may begin to form around the (110) surface orientation of the fin sidewalls, with the growth sticking out from the fin sidewall surface. As the growth continues, it may be limited by the (111) surface orientation, gradually resulting in a diamond shape (with typical characteristic inner angles of 54.7° and 109.4°, i.e., angles between (111) planes), with advantages over a thin rectangular fin shape (as prior to performing SEG) of a greater surface area and volume in the source and drain region, the flexibility of a multi-layer fin structure (e.g., SiGe diamonds on Si fins), and built-in fin stress materials as compared to the conventional surface.

FIG. 2 is a top-down view of one example showing more of the overall structure 100 of FIG. 1, including prior to the epitaxial growth on the source regions 109 and drain regions 111, resulting in the diamond shape, as described above. As shown and described more fully with respect to FIG. 7 (a cross-sectional view taken at line 134 in FIG. 2), a dummy gate with spacers (collectively, 144) spans and encompasses fins 104 above oxide layer 102 covering the substrate. The dummy gate electrode (typically, polysilicon) is situated over and separated from the fin by a thin dielectric (typically, Si-oxide or Si-Oxynitride) and patterned to be perpendicular to and wrapping around or encompassing the fins. The spacer is typically oxide or nitride. The S/D's of fins is the portion of fins not covered by the gate electrode.

Figure 3:
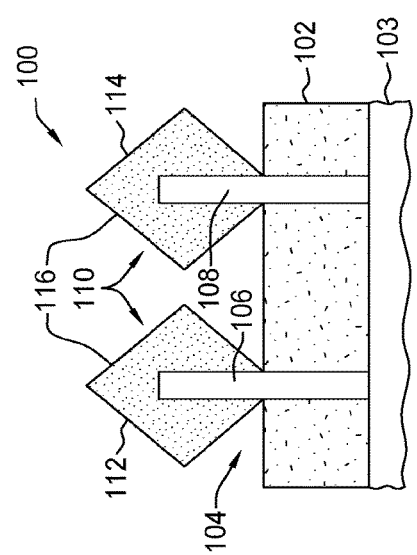
FIG. 3 depicts one example of the structure of FIG. 1 after recessing to expose a portion of the fin sidewalls below the silicon epitaxial growth of the source or drain.

FIG. 3 depicts one example of the structure 100 of FIG. 1 after recessing the layer of oxide 102 to expose a small portion (e.g., about 5 nm to about 15 nm) of the fin sidewalls below the silicon epitaxial growth of the source or drain. For example, oxide 102 has been recessed to expose portion 118 of fin 106, and portion 120 of fin 108, below diamond shaped structures 112 and 114, respectively. Of course, it will be appreciated that the recessing is occurring for many other fins on a given bulk substrate. In one example, the (110) surface of the fin sidewalls is exposed. In a further example, the etching comprises isotropic dry or wet etching (where the etching rate is similar on all planes). In yet a further example, the etching is accomplished using anisotropic wet etching, for example, using potassium hydroxide, ammonium hydroxide and/or tetramethylammonium hydroxide (TMAH or TMAOH), where the wet etching rate on (110) or (100) planes is greater than ten times faster than the etch rate on (111) plane.

Figure 4:
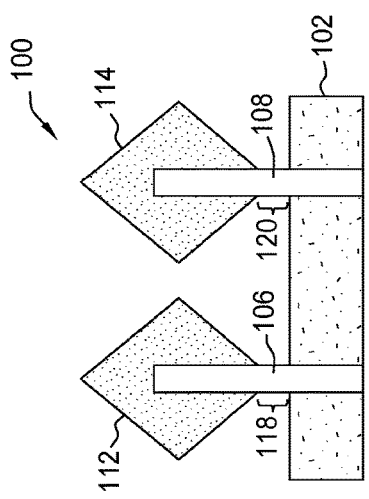
FIG. 4 depicts one example of the structure of FIG. 3 after separating the epitaxial growth from the fin/substrate below.

FIG. 4 depicts one example of the structure 100 of FIG. 3 after separating the diamond shaped epitaxial structures and upper portions 160 and 162 of fins 106 and 108, respectively, from lower fin portions 107 and 113 of fins 106 and 108, respectively. For example, the removal of the epitaxial growth of silicon and/or silicon germanium from the source and drain areas may be performed using isotropic dry or wet etching. In one example, the isotropic dry etching may take the form of, for example, isotropic plasma etching or reactive ion etching (RIE). In another example, the isotropic wet etching may also be performed using etching solutions such as, for example, HF:Nitric:Acetic solution (also known as HNA etch). The isotropic dry etching or the isotropic wet etching would have no preference to the surface orientation of the region to be etched. As a consequence, the fin connection of the diamond-shaped growth in the source and drain areas is etched narrower and finally separated from the fin body, effectively resulting in a slightly reduced size of the diamond-shape structures.

Alternatively, an oxide recess may instead be performed by using an HF dip to expose the (100) or (110) crystal surface orientation at the base of the diamond-shaped structures. The diamond-shaped structure may be separated from the fin body portion by performing a highly selective anisotropic wet etching using hydroxide containing chemical wet etchants. Some examples of the hydroxide-containing etch chemistry include tetramethylammonium hydroxide (TMAH), ammonium hydroxide ($NH_4OH$), potassium hydroxide (KOH) and lithium hydroxide (LiOH). Since the etching rate of Si (100) and (110) surface orientation is about 10 to about 100 times larger than that of (111) surface orientation, hydroxide-containing etch chemistries are one example of a family of etch chemistries that may be selective to the (111) surface orientation of the diamond-shaped epitaxial growth of silicon and silicon germanium surfaces. As a consequence, the base of the diamond shape is completely separated away, and a small V-shape trench may be formed at the top of the fin body (as a result of the slowest etch rate of (111) surface). The gap is nearly the same depth of oxide recess before wet etching as the wet anisotropic process is in a self-stopping manner on the (111) orientation surface.

Figure 5:
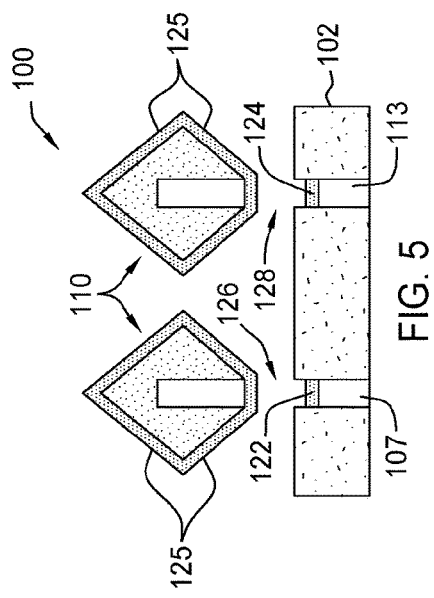
FIG. 5 depicts one example of the structure of FIG. 4 after oxidation to reduce defects on the surfaces of the S/D epitaxial growth and fin/substrate.

FIG. 5 depicts one example of the structure 100 of FIG. 4 after oxidation to reduce defects on the surfaces of the source and drain epitaxial growth and fin body. For example, all exposed surfaces on the shaped epitaxial structures 110 are oxidized (collectively, 125), as well as surfaces 122 and 124 of lower fin portions 107 and 113 of fins 106 and 108, respectively, which are embedded in oxide layer 102, may be oxidized to repair defects created during separation (see FIG. 4). Oxidation can be accomplished in a number of ways. For example, the oxidation can be accomplished using a conventional thermal oxidation process via furnace or RTA (Rapid Thermal Anneal) chamber, typically at temperatures of about 600-800° C. in an oxygen environment. Although reduced in size by the oxidation, gaps remain between the shaped epitaxial structures 110 and the bottom portion of their respective fins from the separation, for example, gaps 126 and 128.

Figure 6:
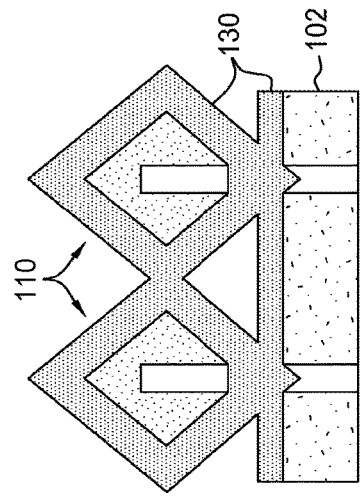
FIG. 6 depicts one example of the reduced defect structure of FIG. 5 after filling in the gaps between the epitaxial growth and the substrate with an insulator.

FIG. 6 is a cross-sectional view taken across line 132 in FIG. 2, and is one example of the reduced-defect structure 100 of FIG. 5 after filling in gaps 126 and 128 with a conformal electrically insulating material, for example, a conformal oxide or nitride. In one example, conformal oxide 130 is deposited in the space separating the shaped epitaxial structures 110 and oxide layer 132, as well as on the shaped epitaxial structures using a conventional deposition process, such as, for example, atomic layer deposition (ALD).

Figure 7:
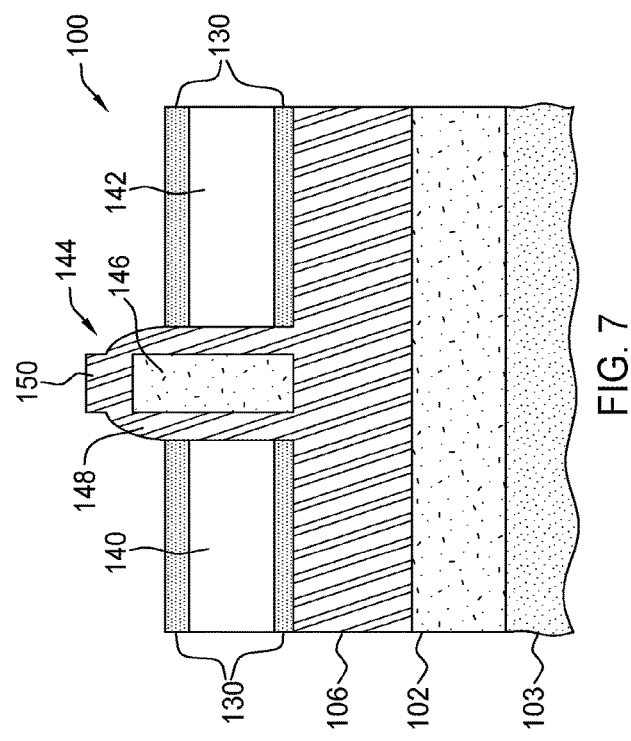
FIG. 7 is a cross-sectional view of the structure of FIG. 2 taken across one of the fins.

FIG. 7 is a cross-sectional view of the structure 100 of FIG. 2 taken across line 134 after deposition of the conformal oxide 130 (see FIG. 5). Shown in FIG. 7 is substrate 103 with oxide layer 102 thereover. Fin 106 includes source 140 and drain 142 surrounded by conformal oxide 130. Although simplified in FIG. 7 for ease of understanding, it will be understood that what is shown as blocks for the source and drain, is actually the shaped epitaxial structures. Also shown between the source and drain is dummy gate 144, including dummy gate electrode material 146 (e.g., poly-Si), spacers 148 and cap 150 (e.g., a nitride). In the present example, a FinFET is being fabricated with a polysilicon (or other "dummy" gate material) gate electrode that, later in fabrication, will be replaced with a metal gate electrode (a "Replacement Metal Gate" process). Typically, the "dummy" gate is removed after source and drain formation and deposition of inter-layer-dielectric (ILD) and CMP (chemical mechanical polishing) until the surface of the dummy gate is exposed, and then continuing the process steps of removing the "dummy gate," followed by the "replacement gate" steps, along with the rest of the contacts and metal interconnections understood by those skilled in the art. However, it will be understood that the present invention would also work with a metal gate electrode upfront, rather than a RMG process.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
   providing a semiconductor structure, the structure comprising: a semiconductor substrate; at least one semiconductor fin having a substantially uniform material composition, the fin coupled to the semiconductor substrate and surrounded at a bottom portion thereof by a dielectric layer, and an active region having a source region, a drain region and a channel region therebetween, the active region comprising a layer of epitaxy surrounding a top portion of the at least one semiconductor fin, a dummy gate encompassing the channel region and a spacer on either side of the dummy gate;
   physically separating the top portion of the at least one semiconductor fin from the bottom portion of the at least one semiconductor fin in the source region and the drain region, the physically separating forming gaps, wherein the physically separating comprises:
   recessing the dielectric layer surrounding the bottom portion of the at least one semiconductor fin, the recessing exposing a center portion of the at least one semiconductor fin between the top portion and the bottom portion; and
   removing the center portion exposed by the recessing, the removing including anisotropically etching the at least one fin and the layer of epitaxy surrounding the fin, wherein the layer of epitaxy has a crystal orientation that is selective to the etching, such that the center portion is removed without substantially reducing the size of the epitaxial layer; and
   after the physically separating, forming a continuous dielectric layer in the gaps and around the layer of epitaxy in the source region and the drain region.

2. The method of claim 1, further comprising:
   after the physically separating and before forming the continuous dielectric layer, reducing defects in the layer of epitaxy and the lower portion of the at least one semiconductor fin resulting from the physically separating.

3. The method of claim 1, wherein the semiconductor structure further comprises at least one other type of semiconductor device, the method further comprising masking the at least one other type of semiconductor device prior to the physically separating.

4. The method of claim 2, wherein reducing defects comprises oxidizing to form oxide around the layer of epitaxy in the source region and the drain region and over the bottom portion of at least one semiconductor fin.

5. The method of claim 1, wherein the center portion of the at least one semiconductor fin has a length of about 5 nm to about 10 nm.

6. The method of claim 1, wherein the semiconductor substrate comprises a bulk semiconductor substrate, wherein the at least one semiconductor fin comprises a plurality of semiconductor fins, and wherein the physically separating and the forming are performed for one or more of the plurality of semiconductor fins.

7. The method of claim 1, wherein the semiconductor structure comprises at least two different types of semiconductor devices, and wherein the physically separating and the forming are performed for at least one of the at least two different types of semiconductor devices.

8. The method of claim 1, wherein the epitaxy comprises epitaxial silicon.

9. The method of claim 1, wherein the epitaxy comprises epitaxial silicon germanium.

10. The method of claim 1, wherein the epitaxy comprises at least one material from each of periodic table column III and column V.

11. The method of claim 1, wherein the epitaxy comprises at least one material from each of periodic table column II and column VI.

12. The method of claim 1 wherein the layer of epitaxy has a 111 crystal orientation.

13. The method of claim 12 wherein the fin has one of a 100 crystal orientation and a 110 crystal orientation.

14. The method of claim 1 wherein the crystal orientation of the fin is etched at a rate that is greater than or equal to 10 times the rate that the crystal orientation of the layer of epitaxy is etched.

* * * * *